United States Patent [19]

Hiroshima et al.

[11] 4,305,137

[45] Dec. 8, 1981

[54] PLANAR MAGNETIC BUBBLE DEVICE

[75] Inventors: Minoru Hiroshima, Mobara; Ryo Suzuki, Kokubunji, both of Japan

[73] Assignee: Hitachi, Ltd., Tokyo, Japan

[21] Appl. No.: 35,254

[22] Filed: May 2, 1979

[30] Foreign Application Priority Data

May 17, 1978 [JP] Japan .................... 53-57640

[51] Int. Cl.³ .................................... G11C 19/08
[52] U.S. Cl. ............................................ 365/39
[58] Field of Search ................................ 365/39

[56] References Cited

U.S. PATENT DOCUMENTS

| | | | |
|---|---|---|---|
| 4,172,758 | 10/1979 | Bailey et al. | 365/39 |
| 4,178,635 | 12/1979 | Rose | 365/39 |
| 4,251,319 | 2/1981 | Bonnie et al. | 365/37 |

FOREIGN PATENT DOCUMENTS

| | | | |
|---|---|---|---|
| 54-136141 | 10/1979 | Japan | 365/39 |
| 55-45159 | 3/1980 | Japan | 365/39 |

OTHER PUBLICATIONS

IEEE Transactions on Magnetics–vol. Mag-12, No. 6, Nov. 1976, pp. 618–621.

*Primary Examiner*—James W. Moffitt
*Attorney, Agent, or Firm*—Charles E. Pfund

[57] ABSTRACT

The basic elements of a magnetic bubble device are laminated. A spacer conductor pattern layer is formed on the same plane as a control conductor pattern layer interposed between a magnetic film which forms and holds magnetic bubbles and a propagation circuit pattern layer adapted to control the magnetic bubbles so as to make substantially uniform the distance between the propagation path and the magnetic film.

4 Claims, 10 Drawing Figures

PLANAR MAGNETIC BUBBLE DEVICE

BACKGROUND OF THE INVENTION

This invention relates to a magnetic bubble device and more particularly, to a magnetic bubble device having an improved magnetic bubble propagation characteristic and capable of being to operate stably over a wide range.

A magnetic bubble device generally comprises a replicate gate circuit, a transfer gate circuit and a bubble generator as its basic elements. A magnetic film for forming and holding therein magnetic bubbles is provided on a monocrystalline substrate and the basic elements are formed on the magnetic film via an insulating spacer. In such a magnetic bubble device, respective basic elements have laminated constructions. More particularly, a conductor pattern layer which passes a control current that controls (divides, propagates, generates, etc.) the magnetic bubbles, an insulating film, a propagation circuit pattern layer having magnetic bubble propagation path segments, and a passivation film are laminated in the order mentioned.

When one looks at a sectional contour of the laminated structure of the basic elements of a prior art magnetic bubble device, the insulating film comes in direct contact with the insulating spacer to cover a wide-area region of the spacer in which the conductor pattern segment does not exist, whereas in the presence of conductor pattern segments, the insulating film rises along the conductor pattern segment to cover the same. Since the insulating film has a uniform thickness, the propagation circuit pattern layer formed on the insulating film rises and lowers in conformity with the surface irregularity of the insulating film.

Considering the distance or spacing between the propagation path segment and the surface of the magnetic film containing magnetic bubbles, the spacing is small at the propagation path segment which is formed on a portion of the insulating film which comes in direct contact with the insulating spacer because of the absence of the conductor pattern segment, whereas the spacing is large at the propagation path segment which is formed on a raised portion of the insulating film due to the presence of the conductor pattern segment. Further, the propagation path segment which bridges adjacent raised portions of the insulating film by way of a valley of the insulating film whose bottom is in direct contact with the insulating spacer bears small, intermediate and large spacings with respect to the insulating spacer in accordance with bottom of the valley, slope of the valley and raised portion. In this manner, in the laminated structure of the prior art magnetic bubble device, the distance or spacing between the propagation path segment and the magnetic film containing the magnetic bubbles is not uniform. Generally speaking, as the spacing of the propagation path becomes different, the characteristic of the bubble propagation path for propagating the magnetic bubbles also becomes different.

The function of bias magnetic field upon the magnetic bubbles varies depending upon the distance of the propagation path from the magnetic film. If the function were too strong, the bubbles would disappear, whereas if the function were too weak, the bubble would be elongated so that they can no longer be called bubbles. For this reason, there exists a stable operation region of the bubble propagation path, and the stable operation region of the bubble propagation path, and the stable operation region of the bubble propagation path at a small distance and that of the bubble propagation path at a large distance do not coincide. Accordingly, a stable operation region common to these bubble propagation path segments is limited. In the propagation path segment bridging raised portions of the insulating film and which has a small distance, an intermediate distance and a large distance with respect to the insulating spacer, the distance changes rapidly between large and small values through the intermediate value so that the stable operation region which is common to the portions at large and small distances and the intermediate distance portion of the propagation path segment becomes narrow, thus limiting the stable operating region of the propagation path segment as a whole.

SUMMARY OF THE INVENTION

Accordingly, it is an object of this invention to provide an improved magnetic bubble device which was a uniform stable operation region and can eliminate the defect described above.

According to this invention, there is provided a magnetic bubble device comprising a monocrystalline substrate, a magnetic film formed on the substrate, the magnetic film being adapted to form and hold magnetic bubbles, an insulating film, and a conductor pattern layer including a hair pin shaped loop which passes current for controlling the magnetic bubbles, and a propagation path pattern layer including magnetic bubble propagation path segments, the layer being laminated on the surface of the magnetic film through the insulating film, wherein there is provided a spacer pattern layer interposed between the propagation path segments and the magnetic film, the spacer pattern layer being formed on the same plane as the conductor pattern layer for maintaining substantially constant the distance between the propagation path segments and the magnetic film.

DESCRIPTION OF THE PREFERRED EMBODIMENTS

Figure 1:
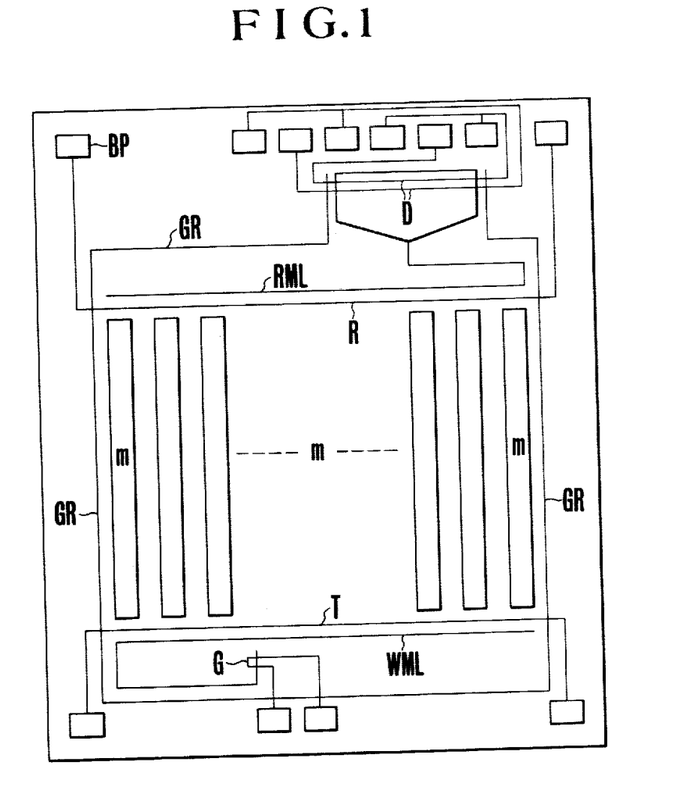
FIG. 1 is a plan view of a magnetic bubble memory chip showing a typical application of a magnetic bubble device.

A typical application of a magnetic bubble device is a magnetic bubble memory chip, one example thereof being shown in FIG. 1. The magnetic bubble memory chip shown in FIG. 1 comprises minor loops m which store information, a read major line RML for propagating read-out information, a write major line WML for propagating writing-in information, a bubble detector D which detects presence or absence of magnetic bubbles and converts the result into an electric signal, a bubble generator G which generates magnetic bubbles, a replicate gate circuit R which replicates or transfers the information in the minor loops m to the read major line RML, a transfer gate circuit T for transferring the information on the write major line WML to the minor loops m, guard rails GR which surround the basic elements described above for preventing invasion of the magnetic bubbles from outside, and bonding pads BP for external connections.

Figure 2:
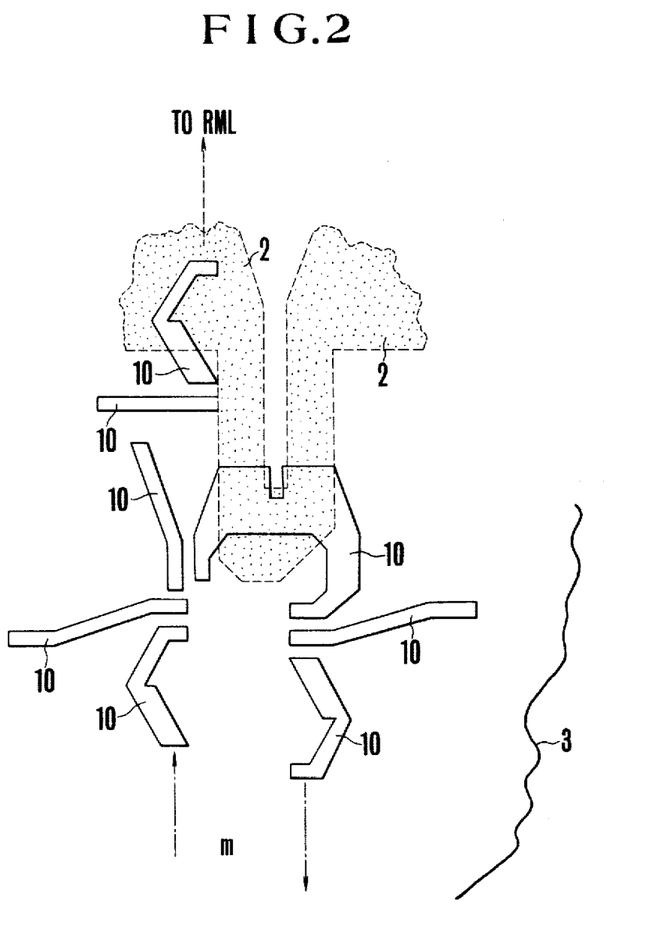
FIGS. 2, 3 and 4 show examples of the pattern of the basic elements of the memory chip shown in FIG. 1.
Figure 3:
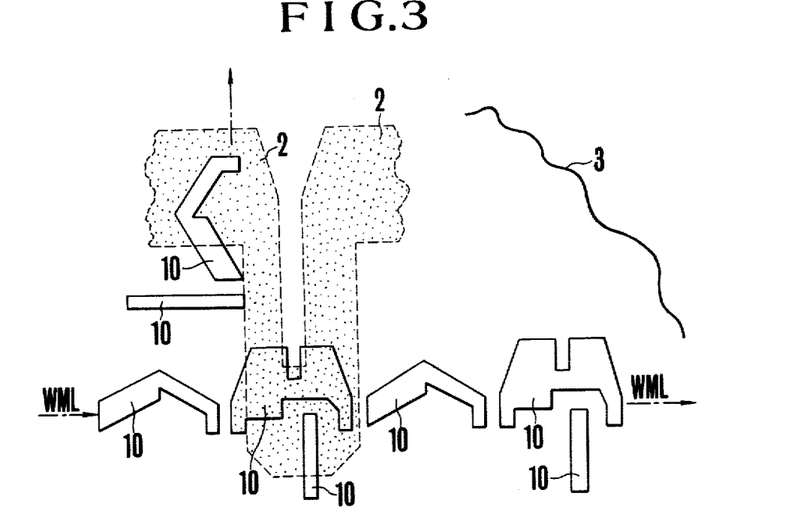
Figure 4:
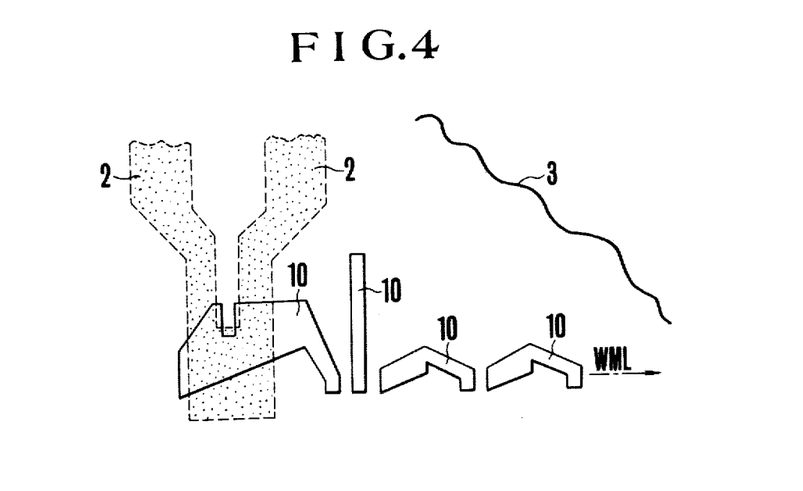

Examples of the patterns of the replicate gate circuit R, the transfer gate circuit T, and the bubble generator G among the basic elements of the magnetic bubble device are shown by FIGS. 2, 3 and 4, respectively. In these Figures, a propagation path for propagating magnetic bubbles which is illustrated as including propagation path segments 10 stands for, for example, the read major line RML, the write major line WML, or the minor loops m. Reference numeral 2 represents a conductor pattern, particularly a hair pin shaped conductor loop which passes operating current for controlling (dividing, propagating and generating) the magnetic bubbles, and 3 a magnetic film containing magnetic bubbles.

Figure 5:
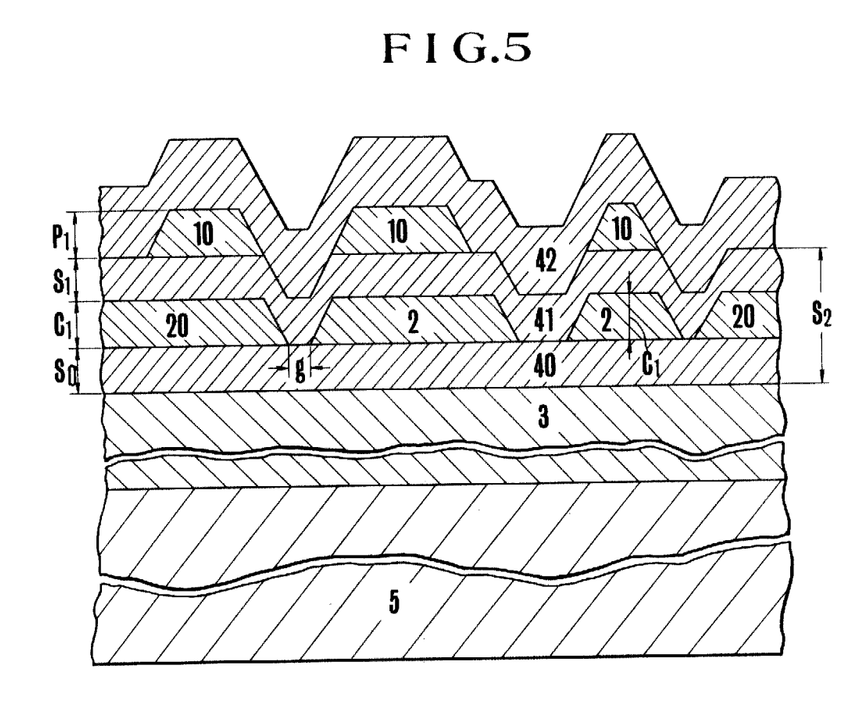
FIG. 5 is a sectional view of one embodiment of the magnetic bubble device of this invention.

FIG. 5 is a sectional view showing the manner of laminating either one of the basic elements on a monocrystalline substrate according to this invention. A substrate 5 is made of gadolinium-gallium garnet (G.G.G.), for example, and a magnetic film 3 for forming and holding magnetic bubbles is epitaxially grown on the substrate. A conductor pattern layer 2 including hair pin shaped conductor loops which act as the bubble control circuits is a vapor deposited non-magnetic conductor layer made of an Al-Cu alloy or an Au-Mo and has a thickness C1 of from 3,000 to 5,000 Å. The propagation path segments 10 comprise layers of soft ferromagnetic material such as permalloy formed by vapor deposition or sputtering, which layers have a thickness P1 of from 3,000 to 4,500 Å. Reference numerals 40, 41 and 42 represent an insulating spacer, an insulating film and a passivation film, respectively, which are formed by sputtering $SiO_2$ or $Al_2O_3$. The insulating spacer 40 has a thickness S0 of from 1,000 to 4,000 Å, and the insulating film 41 has a thickness S1 of from 1,500 to 6,000 Å. Thicknesses of these layers and films lie in a range because the diameter of the magnetic bubbles utilized in the magnetic bubble device lies in a range. The diameter of the magnetic bubbles presently used ranges from 2 to 4 microns. Generally, as the diameter of the magnetic bubble decreases, it is necessary to decrease the thickness of respective layers and films.

According to this invention, a spacer conductor pattern 20 acting as a spacer is formed on the same plane as the conductor pattern layer 2. It is advantageous to prepare the spacer conductor pattern 20 by simultaneously vapor depositing the same material as that utilized to prepare the conductor pattern layer 2 utilized to control the magnetic bubbles. The spacer conductor pattern 20 has the same thickness C1 as the conductor layer 2. The width of insulating zones 41 between the patterns 2 and 20 is shown by g. According to this invention, it is constructed such that either the control conductor pattern 2 or the spacer conductor pattern 20 exists at any portion between any propagation path segment 10 and the magnetic film 3. As a consequence, the distance between any and all propagation path segments 10 and the magnetic film 3 is always S2 at any portion. Thus, $S2 = S0 + C1 + S1$.

Figure 6:
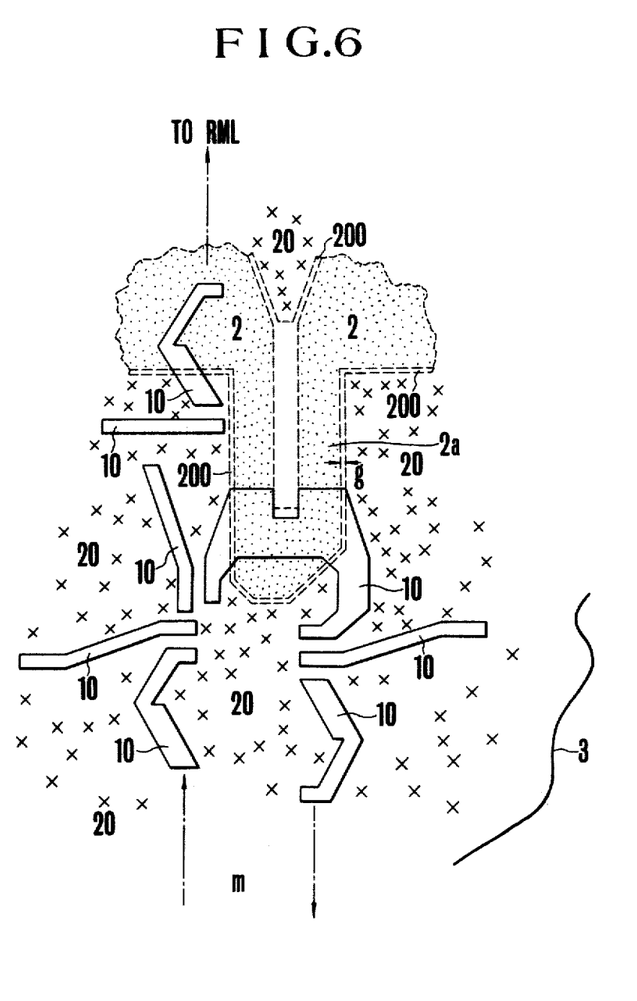
FIG. 6 shows a replicate gate circuit embodying the invention.
Figure 7:
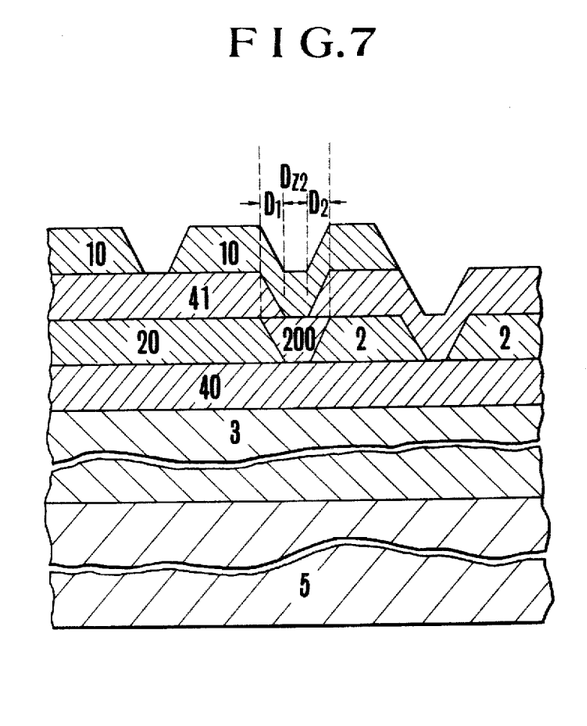
FIG. 7 is a sectional view showing the laminated construction of the embodiment shown in FIG. 6.

FIG. 6 diagrammatically shows one example of a replicate gate circuit R embodying the invention. An insulating band 200 extending along the contour of the pair pin shaped loop 2a of the conductor pattern 2 and adapted to electrically insulate the control conductor pattern 2 from the spacer conductor pattern 20 is formed by sputtering such an insulator as $SiO_2$. In this example, the insulating band has a width g of about 1 to 2 microns. In this example, except for the portion covered with the insulating band 200, the entire area of the magnetic bubble device is covered with the control conductor pattern 2 on the spacer conductor pattern 20. In the same manner, according to this invention, an insulating band is provided along the respective control conductor patterns for the transfer gate circuit T and the bubble generator G so as to electrically insulate the spacer conductor pattern from the control conductor pattern. In the illustrated example, a valley DZ2 would be formed in a particular propagation path segment among a plurality of segments 10 which extends across the insulating band 200 formed along the control conductor pattern 2, as shown in FIG. 7. The valley DZ2 shown in this example has a pair of opposing inclined surfaces D1 and D2 at which the spacing rapidly changes. However, the effects of such closely opposing paired surfaces D1 and D2 are cancelled so that the presence of such a valley does not affect the performance of the bubble propagation path. Thus, in spite of the presence of propagation path segments having valleys, almost all the path segments are spaced from the magnetic film at a definite distance whereby the propagation path pattern is provided at a position spaced substantially a constant distance from the magnetic film.

It will be clear that it is not necessary to provide the spacer conductor pattern for a portion where no bubble propagation path lies. Furthermore, it is not necessary to electrically insulate the spacer conductor pattern from all control conductor patterns. To form a spacer conductor pattern not insulated from a control conductor pattern, the method of adding the spacer conductor pattern and the configuration thereof should be selected such that the distribution of the operating current flowing through the conductor loop would not be disturbed. To this end, the portion where the spacer conductor pattern and the control conductor pattern may be electrically connected should be limited to the site near the tip of the hair pin shaped loop 2a. Because, as shown by an arrow in FIG. 8, the control current I flows through the shortest path along the loop and hence the current is not disturbed by connecting the spacer conductor pattern.

Figure 8:
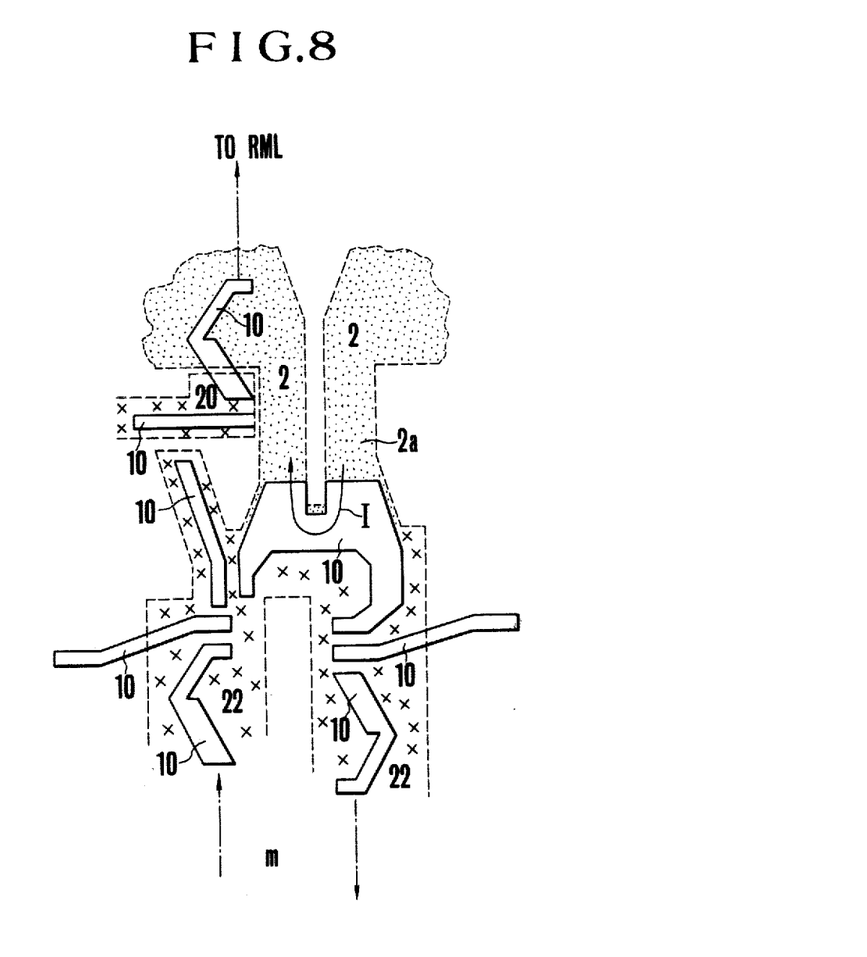
FIGS. 8, 9 and 10 show other embodiments of this invention illustrating a bubble replicate gate circuit, a transfer gate circuit and a bubble generator, respectively.
Figure 9:
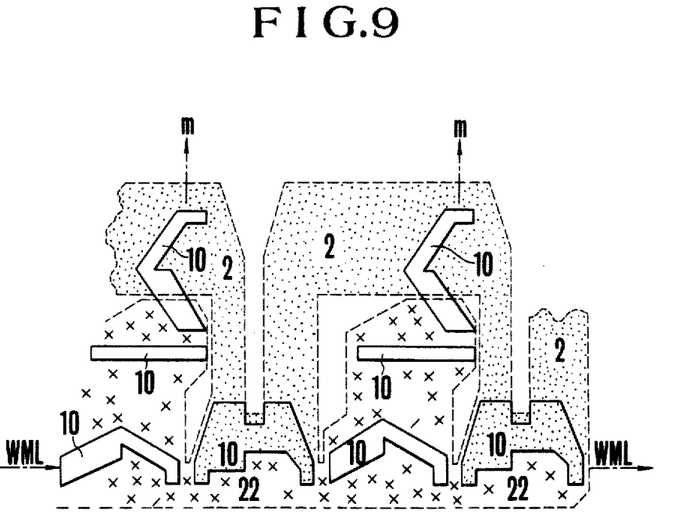
Figure 10:
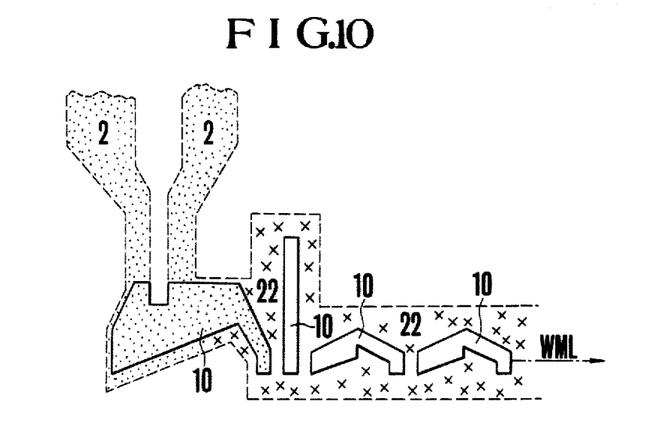

FIGS. 8, 9 and 10 show embodiments of this invention applied to the replicate gate circuit R, the transfer gate circuit T and the bubble generator G, respectively. In these figures, reference numeral 22 designates a spacer conductor pattern added to the conductor loop 2a and electrically connected thereto. Other reference numerals designate identical elements shown in FIG. 6.

As described above, according to this invention, it is possible to make constant the distance between the propagation path segment and the magnetic film and no adverse valley is formed in the propagation path which adversely affects bubble propagation performance, thus providing a magnetic bubble device having excellent operating performance.

What is claimed is:

1. In a magnetic device comprising a monocrystalline substrate, a magnetic film formed on said substrate, said magnetic film being adapted to form and hold magnetic bubbles, an insulating film, a control conductor pattern layer including a hair pin shaped loop which passes current for controlling the magnetic bubbles, and a propagation path pattern layer including magnetic bubble propagation path segments, said layers being laminated on the surface of said magnetic film through said insulating film, the improvement which comprises a spacer conductor pattern layer interposed between said propagation path segments and said magnetic film, said spacer conductor pattern layer being formed on the same plane as said control conductor pattern layer for maintaining substantially constant the distance between said propagation path segments and said magnetic film and which further comprises an insulating layer formed along the contour of said conductor pattern layer for electrically insulating the same from said spacer pattern layer.

2. In a magnetic device comprising a monocrystalline substrate a magnetic film formed on said substrate, said magnetic film being adapted to form and hold magnetic bubbles, an insulating film, a control conductor pattern layer including a hair pin shaped loop which passes current for controlling the magnetic bubbles, and a propagation path pattern layer including magnetic bubble propagation path segments, said layers being laminated on the surface of said magnetic film through said insulating film, the improvement which comprises a spacer conductor pattern layer interposed between said propagation path segments and said magnetic film, said spacer conductor pattern layer being formed on the same plane as said control conductor pattern layer for maintaining substantially constant the distance between said propagation path segments and said magnetic film wherein a portion of said spacer conductor pattern layer is electrically connected to said control conductor pattern layer.

3. A magnetic bubble device according to claim 2 wherein said spacer conductor pattern layer is connected to a portion near the tip of said hair pin shaped loop of said control conductor pattern layer.

4. A magnetic bubble device according to claim 1, 1, 2 or 3 wherein said spacer conductor pattern layer and said control conductor pattern layer are made of the same material and have the same thickness.

* * * * *